(12) United States Patent
Kim et al.

(10) Patent No.: US 8,741,672 B2
(45) Date of Patent: Jun. 3, 2014

(54) CRYSTALLIZATION METHOD OF THIN FILM TRANSISTOR, THIN FILM TRANSISTOR ARRAY PANEL AND MANUFACTURING METHOD FOR THIN FILM TRANSISTOR ARRAY PANEL

(75) Inventors: Joo-Han Kim, Yongin-si (KR); Hwa-Dong Jung, Seoul (KR); Wan-Soon Lim, Cheonan-si (KR); Jee-Hun Lim, Seongnam-si (KR); Joo Seok Yeom, Seoul (KR); Tae-Kyung Yim, Seoul (KR); Jae-Hak Lee, Seoul (KR); Hyuk Soon Kwon, Suwon-si (KR); Hyoung Cheol Lee, Suwon-si (KR); Jeong-Ju Park, Seoul (KR); Se-Myung Kwon, Seongnam-si (KR); So-Young Koo, Incheon (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 13/535,007

(22) Filed: Jun. 27, 2012

(65) Prior Publication Data
US 2013/0037813 A1 Feb. 14, 2013

(30) Foreign Application Priority Data
Aug. 12, 2011 (KR) .................... 10-2011-0080820

(51) Int. Cl.
*H01L 21/00* (2006.01)
*H01L 21/84* (2006.01)

(52) U.S. Cl.
USPC ...... 438/30; 438/149; 438/486; 257/E51.007; 257/E29.151

(58) Field of Classification Search
USPC ............. 438/149, 486, FOR. 184, FOR. 201; 257/E51.005, E29.151
See application file for complete search history.

(56) References Cited

U.S. PATENT DOCUMENTS

| | | | |
|---|---|---|---|
| 5,888,839 A * | 3/1999 | Ino et al. ................... | 438/30 |
| 7,300,858 B2 | 11/2007 | Im | |
| 2003/0148594 A1 * | 8/2003 | Yamazaki et al. ............ | 438/487 |

FOREIGN PATENT DOCUMENTS

WO   WO 2011158612 A1 * 12/2011 ............ H01L 21/268

* cited by examiner

*Primary Examiner* — Michelle Mandala
(74) *Attorney, Agent, or Firm* — H.C. Park & Associates, PLC

(57) ABSTRACT

Exemplary embodiments of the invention disclose a method of manufacturing a thin film transistor array panel having reduced overall processing time and providing a uniform crystallization. Exemplary embodiments of the invention also disclose a crystallization method of a thin film transistor, including forming on a substrate a semiconductor layer including a first pixel area, a second pixel area, and a third pixel area. The crystallization method includes crystallizing a portion of the semiconductor layer corresponding to a channel region of a thin film transistor using a micro lens array.

16 Claims, 22 Drawing Sheets

CRYSTALLIZATION METHOD OF THIN FILM TRANSISTOR, THIN FILM TRANSISTOR ARRAY PANEL AND MANUFACTURING METHOD FOR THIN FILM TRANSISTOR ARRAY PANEL

CROSS REFERENCE TO RELATED APPLICATION

This application claims priority from and the benefit of Korean Patent Application No. 10-2011-0080820, filed on Aug. 12, 2011, which is hereby incorporated by reference for all purposes as if fully set forth herein.

BACKGROUND OF THE INVENTION

1. Field of the Invention

Exemplary embodiments of the present invention relate to a crystallization method of a thin film transistor, a thin film transistor array panel, and a method for manufacturing a thin film transistor array panel.

2. Discussion of the Background

Interest in an information display system has largely increased and a demand for using a portable information medium has also increased, such that research and commercialization for a light and thin film type flat panel display (FPD) instead of a conventional cathode ray tube (CRT) has also increased. A liquid crystal display (LCD) is a flat panel displays that displays an image by using optical anisotropy of a liquid crystal. LCDs have excellent resolution, color display, and image quality and may actively be applied to a monitor of a laptop computer or desktop monitor.

A LCD may be driven in an active matrix (AM) mode, which is a mode of driving the liquid crystal of a pixel unit by using an amorphous silicon thin film transistor (TFT) as a switching element.

However, due to electric mobility of the amorphous silicon thin film transistor, there is a limit to what the amorphous silicon thin film transistor can be used for in a peripheral circuit requiring a high speed operation. Accordingly, by using a crystalline silicon thin film transistor having a field effect mobility larger than the field effect mobility of the amorphous silicon thin film transistor, research for integrating the pixel unit and a driving circuit unit on a glass substrate has actively progressed.

A crystallization method of an amorphous silicon thin film uses a sequential lateral solidification (SLS) method and an excimer laser annealing (ELA) method.

However, since the excimer laser annealing (ELA) method and the sequential lateral solidification (SLS) method are performed as an entire surface scanning method, the crystallization process time is undesirably long.

The above information disclosed in this Background section is only for enhancement of understanding of the background of the invention and therefore it may contain is information that does not form the prior art that is already known in this country to a person of ordinary skill in the art.

SUMMARY OF THE INVENTION

Exemplary embodiments of the present invention provide a thin film transistor array panel having advantages of reducing a process time and having a uniform crystallization and a crystallization method of a thin film transistor.

Additional features of the invention will be set forth in the description which follows, and in part will be apparent from the description, or may be learned by practice of the invention.

Exemplary embodiments of the present invention disclose a manufacturing method for a thin film transistor array panel. The method comprises forming a gate line including a gate electrode on a substrate and forming a gate insulating layer covering the gate line. The method further includes forming a semiconductor layer on the gate insulating layer; crystallizing the semiconductor layer; forming a data line crossing the gate line, a source electrode connected with the data line, and a drain electrode facing the source electrode on the semiconductor layer. The method also includes forming a passivation layer on the source electrode and the drain electrode, in which in a step of crystallizing of the semiconductor layer, a portion corresponding to a channel region of a thin film transistor is locally crystallized by using a micro lens array.

The micro lens array may include a plurality of micro lenses corresponding to a plurality of channel regions disposed at each pixel.

An overall planar shape of the data line, the source electrode, the drain electrode may be formed so as to be the same as the semiconductor layer except for the channel region.

The semiconductor layer may include a first region and a second region, the first region of the semiconductor layer may include the channel region and have a wider range than the channel region, and the second region of the semiconductor layer may be formed so as to correspond to the rest portion except for the first region of the semiconductor layer.

The step of crystallizing of the semiconductor layer may use complete melting crystallization or partial melting crystallization.

In the step of crystallizing of the semiconductor layer, the first region may be locally irradiated by a laser at least two times.

Energy density of the second laser irradiation or more may be smaller than that of the first laser irradiation.

Exemplary embodiments of the present invention also disclose a crystallization method of a thin film transistor, including forming a semiconductor layer on a substrate including a first pixel area, a second pixel area, and a third pixel area. The method further includes aligning the substrate on a stage; crystallizing the semiconductor layer disposed at a first region of the first pixel area. The method further includes crystallizing the semiconductor layer disposed at a second region of the second pixel area adjacent to the first pixel area, crystallizing the semiconductor layer disposed at a third region of the third pixel area adjacent to the second pixel area, in which the first region, the second region, and the third region respectively correspond to channel regions of the first pixel area, the second pixel area, and the third pixel area, respectively. The method also includes crystallization of the semiconductor layer disposed at the first region, the second region and the third region using a micro lens array.

The crystallization method of a thin film transistor may further include moving the substrate between the crystallizing of the semiconductor layer disposed at the first region and is the crystallizing of the semiconductor layer disposed at the second region and between the crystallizing of the semiconductor layer disposed at the second region and the crystallizing of the semiconductor layer disposed at the third region.

The crystallizing of the semiconductor layer disposed at the first region, the second region, and the third region may include separating a beam source and collecting the separated beam source.

The crystallization method of a thin film transistor may further include changing a light path of the beam source by a mirror between the separating of the beam source and the collecting of the separated beam source.

The crystallization method of a thin film transistor may further include collecting the separated beam source before the changing of the light path of the beam source.

The separating of the beam source may include patterning the beam source.

The first pixel area, the second pixel area, and the third pixel area may correspond to a red pixel, a green pixel, and a blue pixel, respectively.

The crystallizing of the semiconductor layer may use complete melting crystallization or partial melting crystallization.

In a step of crystallizing of the semiconductor layer, the first region, the second region, and the third region may be locally irradiated by a laser at least two times, respectively.

Energy density of the second laser irradiation or more may be smaller than that of the first laser irradiation.

Exemplary embodiments of the present invention also disclose a thin film transistor array panel including: a substrate; a gate line disposed on the substrate and including a gate electrode. The thin film transistor array panel further includes a gate insulating layer is disposed on the gate line; a semiconductor layer disposed on the gate insulating layer, including a first region and a second region. The thin film transistor array panel also includes a data line disposed on the semiconductor layer and crossing the gate line, a source electrode connected with the data line, and a drain electrode facing the source electrode. The thin film transistor array panel further includes a passivation layer disposed on the data line, the source electrode, and the drain electrode, in which the first region is made of crystalline silicon and the second region is made of amorphous silicon and the first region is disposed to correspond to the channel region of a thin film transistor and the second region is disposed around the first region.

Exemplary embodiments of the present invention also disclose a thin film transistor, including a control electrode, an input electrode, an output electrode, and a semiconductor layer disposed between the control electrode and the input and output electrodes. The semiconductor layer comprises a first region of crystallized silicon and a second region of amorphous silicon.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
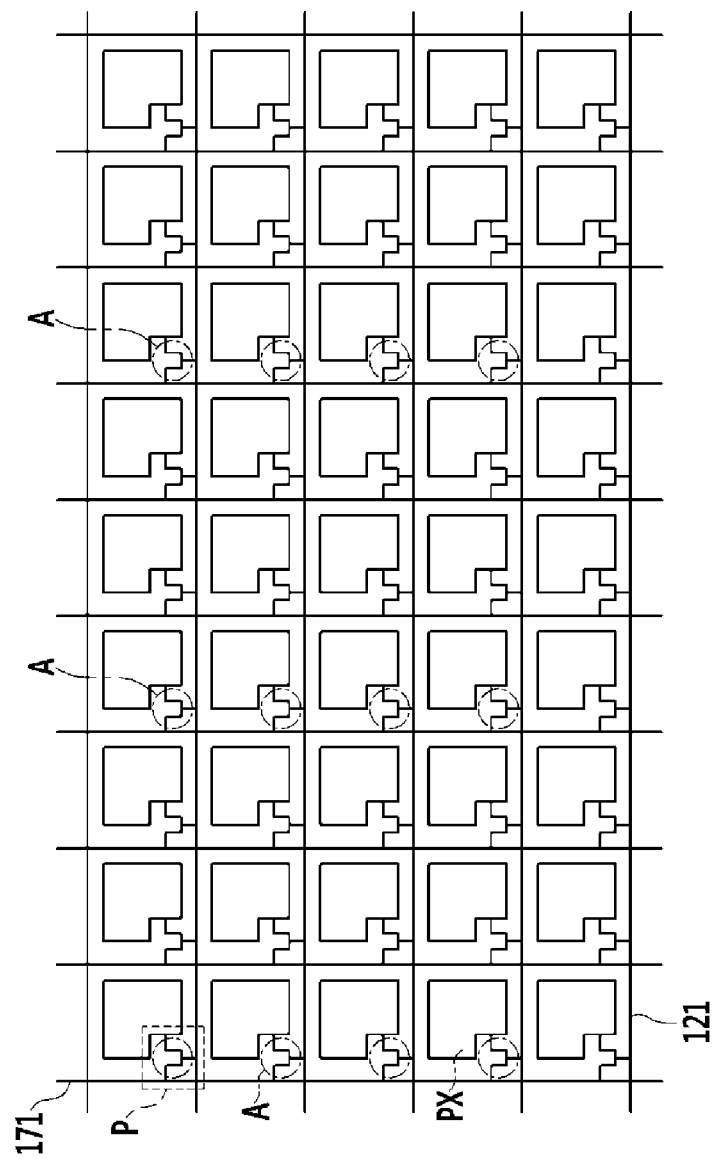
FIG. 1, FIG. 3, and FIG. 4 are schematic layout views illustrating a crystallization is method of a thin film transistor according to exemplary embodiments of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements It will be understood that when an element such as a layer, film, region, or substrate is referred to as being "on", "connected to" or "coupled to" another element or layer, it is can be directly on, connected or coupled to the other element or layer or intervening elements or layers may be present. In contrast, when an element is referred to as being "directly on," "directly connected to" or "directly coupled to" another element or layer, there are no intervening elements or layers present.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the is singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof. It should be understood that for the purposes of this disclosure, "at least one of X, Y, and Z" can be construed as X only, Y only, Z only, or any combination of two or more items X, Y, and Z (e.g., XYZ, XYY, YZ, ZZ).

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, exemplary embodiments of the present invention will be explained in detail with reference to the accompanying drawings.

Figure 2:
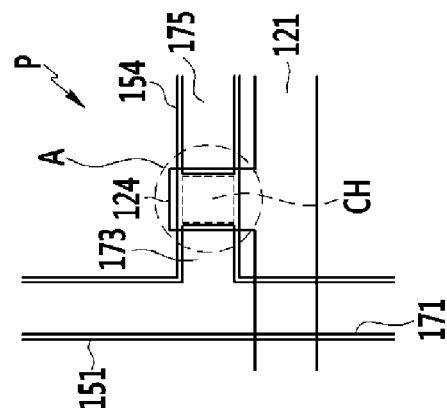
FIG. 2 is an enlarged view illustrating P of FIG. 1 according to exemplary embodiments of the present invention.
Figure 3:
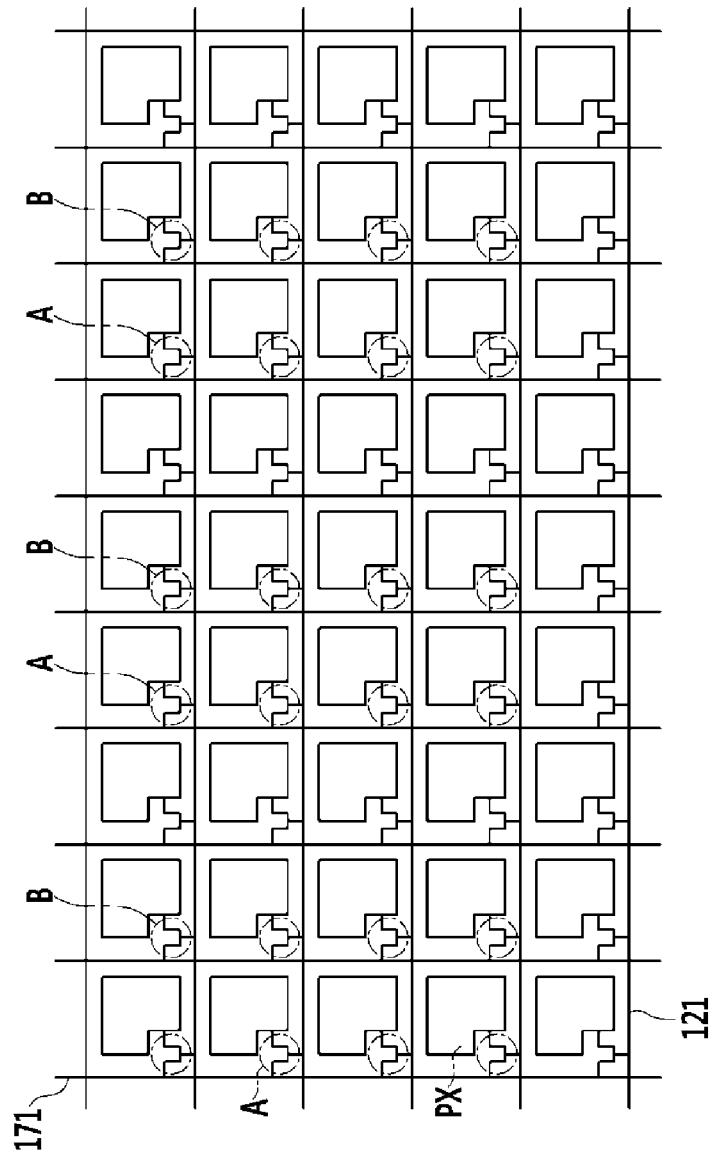
Figure 4:
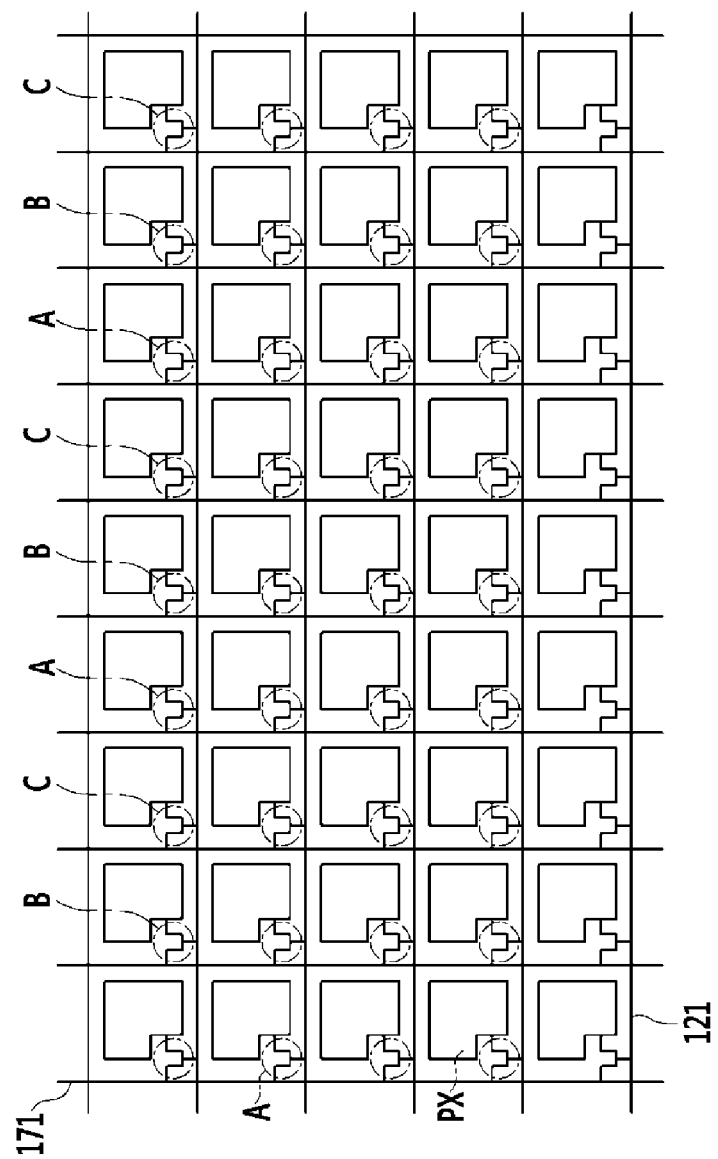

FIG. 1, FIG. 3 and FIG. 4 are schematic layout views illustrating a crystallization method of a thin film transistor according to exemplary embodiments of the present invention. FIG. 2 is an enlarged view illustrating P of FIG. 1 according to exemplary embodiments of the present invention.

Referring to FIG. 1 and FIG. 2, in a crystallization method of a thin film transistor according to exemplary embodiments of the present invention, a gate line 121 for transferring a gate signal on an insulation substrate may be formed (not shown) and may extend in a horizontal direction. In addition, a gate electrode 124 protruding from the gate line 121 may be formed. Thereafter, an insulating layer may be formed on the gate electrode 124, and a semiconductor layer made of amorphous silicon may be formed on the insulating layer.

A pixel unit PX may include a first pixel area, a second pixel area, and a third pixel area. The first pixel area may be a red pixel area. A first region A may correspond to a channel region CH of the thin film transistor. The first pixel area, the second pixel area, and the third pixel area may include a plurality of pixels arranged in the same column, respectively. Laser may be irradiated on the first region.

Referring to FIG. 3, the laser may be irradiated at a second region B which may be a part of the second pixel area adjacent to the first pixel area. The second pixel area may be a green pixel area. The second region B may correspond to the channel region CH of the thin film transistor.

Referring to FIG. 4, the laser may be irradiated at a third region C which may be a part of the third pixel area adjacent to the second pixel area. The third pixel area may be a blue pixel area. The third region C may correspond to the channel region CH of the thin film transistor.

The first region A, the second region B, and the third region C which may correspond to the channel region CH on the substrate and may repetitively crystallized by the method described above. The substrate, including the first region A, the second region B, and the third region C, may be crystallized in any suitable order, and, in some cases, may be crystallized in an X-axis direction. When crystallization in the X-axis direction is completed, the regions corresponding to the channel region CH of the thin film transistor may repetitively be crystallized again in a Y-axis direction.

The crystallization may use complete melting crystallization or partial melting crystallization.

In the partial melting crystallization, since amorphous silicon remains in a volume shape at an initial melted portion and the remaining amorphous silicon may be crystallized as a seed in the crystallization process, there may be an increase in crystal size. Meanwhile, in the complete melting crystallization, since the entire amorphous silicon thin film may be melted and then, a nucleation may randomly be generated without the seed, the crystal size may be small as compared with the partial melting crystallization, however, the crystal size may become uniform.

In some cases, multi shot crystallization may be used as a method for increasing the crystal size. In the multi shot crystallization, a region may be laser-irradiated with more than one laser irradiation to increase the size of a crystal. According to experimental results, the crystal size of an upper area of the semiconductor layer was larger after performing multi shot crystallization compared to after performing the complete melting crystallization. Furthermore an offset current may decrease resulting in an improvement in the electric characteristic of the thin film transistor. For example, the first region A comprises an upper region and a lower region and a grain size of crystalline silicon in the upper region is different from a grain size of crystalline silicon in the lower region.

Thereafter referring to FIG. 2, an ohmic contact layer (not shown), a data line 171 transferring a data signal and extending in a vertical direction, a source electrode 173 connected to the data line 171, and a drain electrode 175 facing the source electrode 173 may be formed on the semiconductor layer. A semiconductor layer 151 formed along the data line 171 and a semiconductor layer protrusion 154 protruding from the semiconductor layer 151 so as to overlap the gate electrode 124 may be disposed on the gate electrode 124.

The gate electrode 124, the source electrode 173, and the drain electrode 175 form at least a part of a thin film transistor (TFT) together with the protrusion 154 of the semiconductor layer 151 and a channel of the thin film transistor formed at the protrusion 154 between the source electrode 173 and the drain electrode 175.

Referring to FIG. 2, the first region A as the laser irradiated region may have a substantially larger area than an area of the channel region CH. In some cases, the first region A may be, at most, three times the area of the channel region CH.

When the laser is irradiated at the first region A, the second region B, and the third region C, the semiconductor layer 151 made of amorphous silicon and the protrusion 154 of the semiconductor layer 151 may be locally crystallized by using a micro lens array. The micro lens array may include a plurality of micro lenses corresponding to a plurality of channel regions disposed in each pixel area.

Since the first region A, the second region B, and the third region C correspond to the channel region, the protrusion 154 of the semiconductor layer may be crystallized and the semiconductor layer 151 disposed around the channel region remains in the amorphous silicon state. Accordingly, it may be possible to minimize heat loss due to a metal material disposed around the semiconductor layer.

Unlike a sequential lateral solidification (SLS) method and an excimer laser annealing (ELA) method in related art, as described hereinabove, the laser irradiation may not be repetitively performed and the crystallized region may be crystallized by the laser irradiation once, such that the thin film transistor having uniform crystallization may be acquired.

Figure 5:
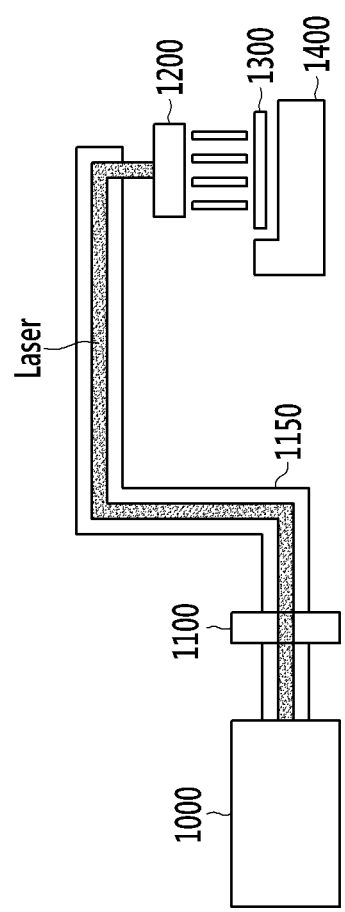
FIG. 5 is a schematic diagram illustrating a crystallization apparatus used in a crystallization method of a thin film transistor according to exemplary embodiments of the present invention.

FIG. 5 is a schematic diagram illustrating a crystallization apparatus used in a crystallization method of a thin film transistor according to exemplary embodiments of the is present invention.

Referring to FIG. 5, a crystallization apparatus according to exemplary embodiments may include a beam source 1000, a pulse time amplifier 1100, which increases a pulse time of the beam generated in the beam source 1000, a beam guide 1150 guiding the beam, a collecting unit 1200, and a stage 1400. A substrate 1300 may be disposed on the stage 1400 according to a crystallization process.

A crystallization method of the thin film transistor using the crystallization apparatus will be briefly described.

An amorphous silicon thin film (not shown) may be formed on the substrate 1300 and the substrate 1300 may be disposed on the stage 1400. A laser generated from the beam source 1000 passes through the pulse time amplifier 1100 such that the pulse time and the crystallization time increases.

A micro lens array including a plurality of micro lenses which may be arranged so as to correspond to a region in which a channel of the thin film transistor is to be formed, may be disposed at the collecting unit 1200. In addition, the collecting unit 1200 may control a size and a shape of the beam by disposing a mask on the micro lens array. The beam transferred through the beam guide 1150 may be separated and collected in the collecting unit 1200.

In crystallizing the semiconductor layer described above, the beam source may be separated and may be collected at the collecting unit 1200 in a lump. However, in some cases, a minor may be inserted between the separation of the beam source and the collection of the beam source to change the light path of the beam source, such that the separation of the beam source and the collection of the separated beam source may be separately progressed.

In some cases, the crystallization of the semiconductor layer may include is separating the beam source, primarily (initially) collecting the beam source, changing a light path of the beam source by a mirror, and secondarily collecting the beam source.

The beam passing through the collecting unit 1200 and collected by the micro lens may be irradiated on the amorphous silicon thin film disposed on the substrate 1300 such that a local crystallization may be performed.

FIG. 6, FIG. 7, FIG. 8, FIG. 9, FIG. 10, FIG. 11, FIG. 12 and FIG. 13 are cross-sectional views illustrating a manufacturing method for a thin film transistor array panel according to exemplary embodiments of the present invention.

Figure 6:
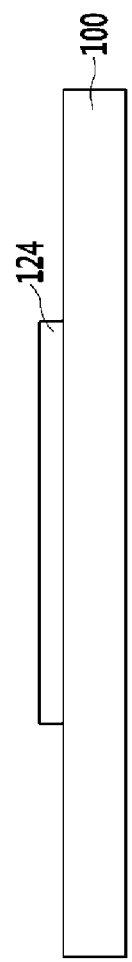
FIG. 6, FIG. 7, FIG. 8, FIG. 9, FIG. 10, FIG. 11, FIG. 12 and FIG. 13 are cross-sectional views illustrating a manufacturing method for a thin film transistor array panel according to exemplary embodiments of the present invention.

Referring to FIG. 6, a gate electrode 124 may be formed on an insulation substrate 100. As shown in FIG. 1, the gate electrode 124 may be formed by protruding from a gate line configured to transfer a gate signal. The gate electrode 124 may be made of any suitable material, including, for example, aluminum, an aluminum alloy, silver, a silver alloy, copper, and a copper alloy. Further, although not shown, the gate electrode 124 may be formed by combining one or more layers having different physical properties.

Figure 7:
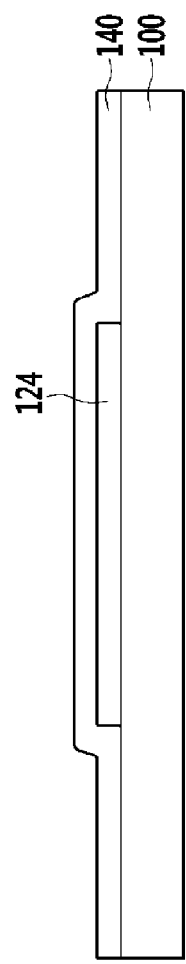

Referring to FIG. 7, a gate insulating layer 140 may be formed on the gate electrode 124. The gate insulating layer 140 may be made of any suitable insulating material such as silicon oxide or silicon nitride.

Figure 8:
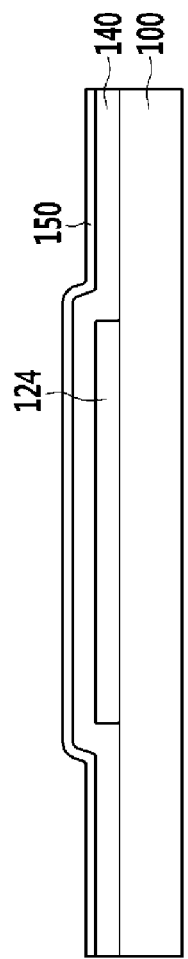

Referring to FIG. 8, a semiconductor layer 150 may be formed on the gate insulating layer 140. The semiconductor layer 150 may be made of any suitable material. In some cases the semiconductor layer 150 may be made of amorphous silicon and have a thickness of 200 to 2500 Å.

Figure 9:
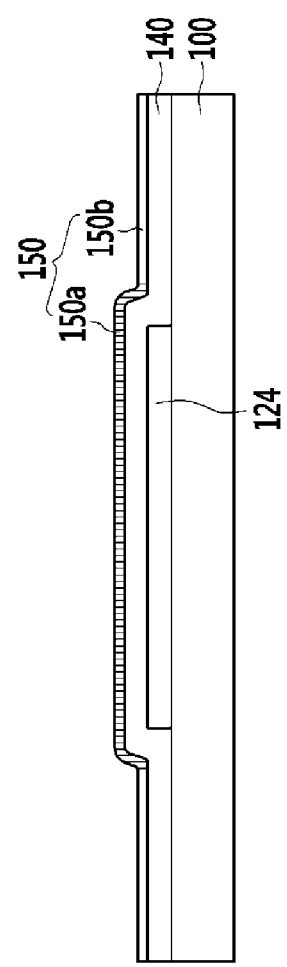

Referring to FIG. 9, a portion of the semiconductor layer 150 corresponding to the gate electrode 124 may be locally crystallized by using the crystallization apparatus described in FIG. 5 to form a first region 150a made of crystalline silicon. A second region 150b remains amorphous silicon.

Figure 10:
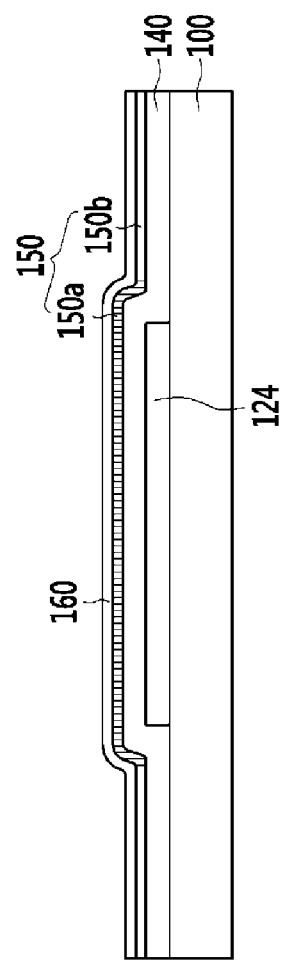

Referring to FIG. 10, a silicon layer 160, which may be made of amorphous silicon doped with an impurity, silicide, etc., may be formed on the semiconductor layer 150.

Figure 11:
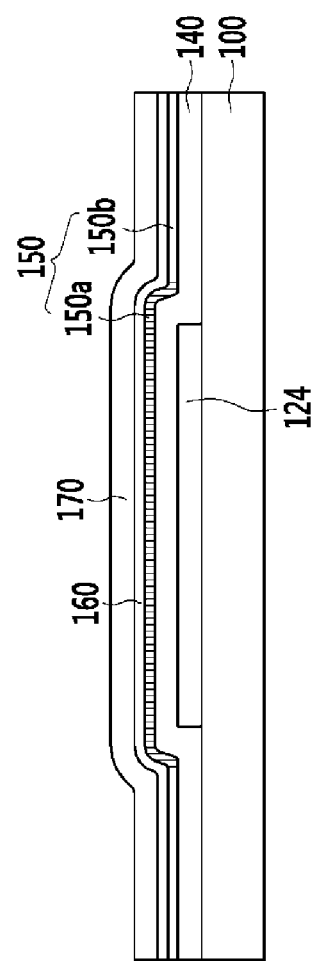

Referring to FIG. 11, a data conductive layer 170 may be formed on the silicon layer 160. The data conductive layer 170 may be made of any suitable material, including, for example, aluminum, an aluminum alloy, silver, a silver alloy, copper, and a copper alloy, tantalum (Ta), and titanium (Ti). The data conductive layer 170 may have a multilayer structure including two or more conductive layers (not shown).

Figure 12:
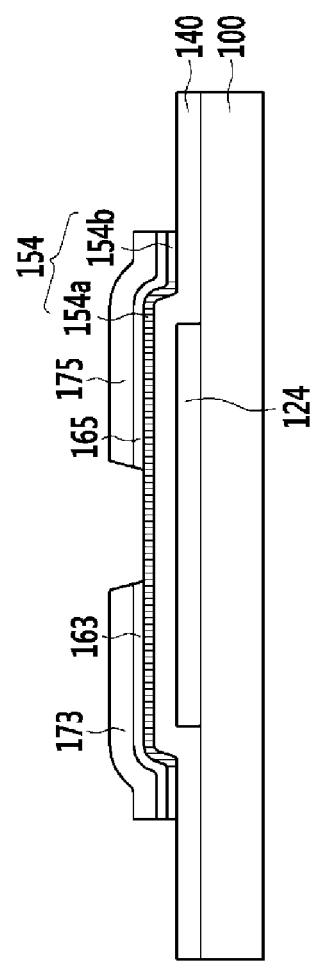

Referring to FIG. 12, the data conductive layer 170, the silicon layer 160, and the semiconductor layer 150 may be patterned by using the same mask.

The data conductive layer 170, the silicon layer 160, and the semiconductor layer 150 may be patterned by using a four sheet mask process but the semiconductor layer 151 may be patterned first and then, the data conductive layer 170 and the silicon layer 160 may be patterned. The semiconductor layer 150 may be patterned to form a semiconductor 154 including a channel region. The semiconductor 154 may include a first region 154a made of crystalline silicon and a second region 154b made of amorphous silicon.

The silicon layer 160 may be patterned to form ohmic contact layers 163 and 165 and the data conductive layer 170 may be patterned to form a source electrode 173 and a drain electrode 175 facing the source electrode 173. Although not shown, the data line connected with the source electrode 173 to transfer the data signal may be formed as described in FIG. 1.

The channel region includes the portion of the semiconductor 154 between the source electrode 173 and the drain electrode 175.

In the thin film transistor formed by the four-sheet mask process as described hereinabove, an overall planar shape of the data line, the source electrode 173, and the drain electrode 175 may be formed so as to be substantially same as the semiconductor 154 except for the channel region. An overall shape of the data line, the source electrode, the drain electrode formed maybe same as the semiconductor layer except for a shape of the channel region. In other words, the side walls of the data line, the source electrode 173, and the drain electrode 175 may be arranged to be substantially the same as side walls of the semiconductor disposed therebelow except for the channel region.

Figure 13:
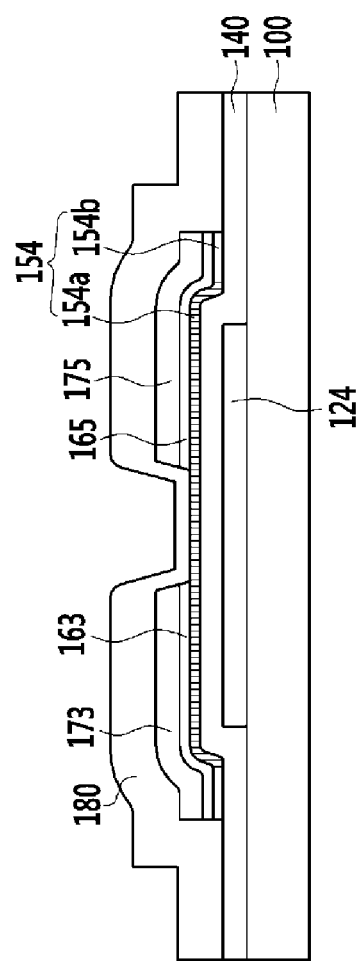

Referring to FIG. 13, a passivation layer 180 may be formed to cover the gate insulating layer 140, the source electrode 173, and the drain electrode 175. The passivation layer 180 may be made of any suitable material including, for example, an inorganic insulator such as silicon nitride or silicon oxide, an organic insulator, and a low dielectric insulator.

Although not shown, a contact hole may be formed by pattering the passivation layer 180 and a pixel electrode which may be electrically connected to the drain electrode 175 through the contact hole and may be formed on the passivation layer 180.

In some cases if the thin film transistor array panel is formed in a bottom gate structure, a metal material such as the gate electrode may be formed before the amorphous semiconductor layer which may be subject to crystallization. Accordingly, energy may be removed to the metal material in the crystallization process such that heat loss may be generated. Further, in a back channel etch process for forming the channel region, in order to prevent a loss of the semiconductor layer, the semiconductor layer should be formed with a sufficient thickness. Therefore, in order to uniformly crystallize the amorphous silicon, a beam source having sufficient energy density may be used. Since the semiconductor portion corresponding to is the channel region may be locally crystallized, the energy density may increase, such that the crystallization may be performed uniformly and the heat loss due to the gate electrode 124 may be minimized. In some exemplary embodiments, regions of the amorphous silicon to be crystallized may be irradiated with a laser two or more times. Moreover, when irradiating the amorphous silicon multiple times, an energy density of the laser may be less in the second, as well as any subsequent, irradiations as compared to the laser's energy density in the first irradiation.

FIG. 14, FIG. 15, FIG. 16, FIG. 17, FIG. 18, FIG. 19, FIG. 20, FIG. 21 and FIG. 22 are cross-sectional views illustrating a manufacturing method for a thin film transistor array panel according to exemplary embodiments of the present invention.

A manufacturing method for a thin film transistor array panel according to the exemplary embodiment may include forming a gate electrode 124, a gate insulating layer 140, and a semiconductor layer 150 on an insulation substrate 100 as described in FIG. 6, FIG. 7 and FIG. 8.

Figure 14:
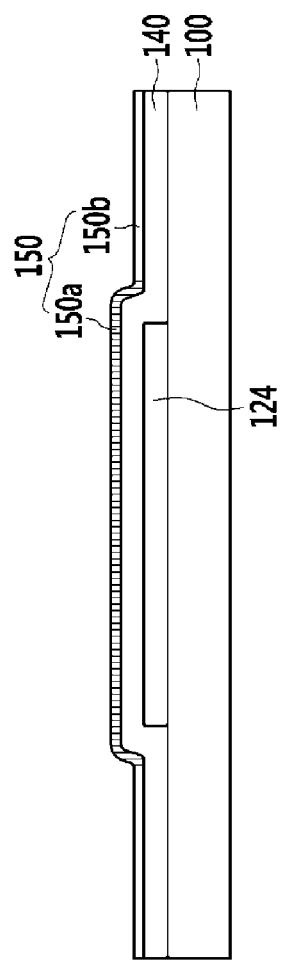
FIG. 14, FIG. 15, FIG. 16, FIG. 17, FIG. 18, FIG. 19 FIG. 20, FIG. 21 and FIG. 22 are cross-sectional views illustrating a manufacturing method for a thin film transistor array panel according to exemplary embodiments of the present invention.

Referring to FIG. 14, a portion of the semiconductor layer 150 may correspond to the gate electrode 124 may be locally crystallized by using the crystallization apparatus described in FIG. 5. A first region 150a made of crystalline silicon by locally crystallizing the semiconductor layer 150. A second region 150b remains amorphous silicon.

Figure 15:
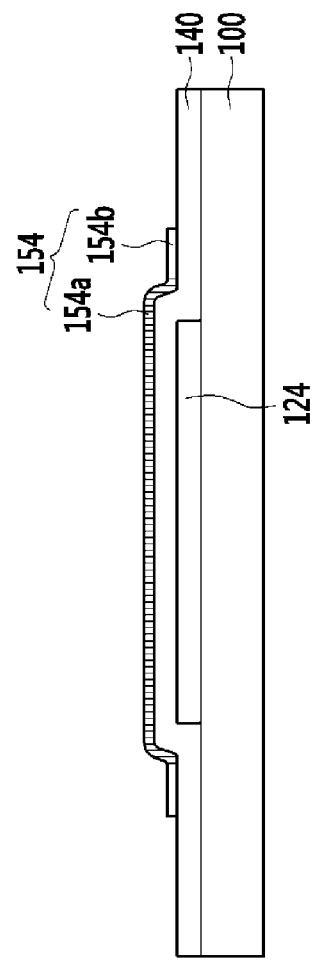
Figure 16:
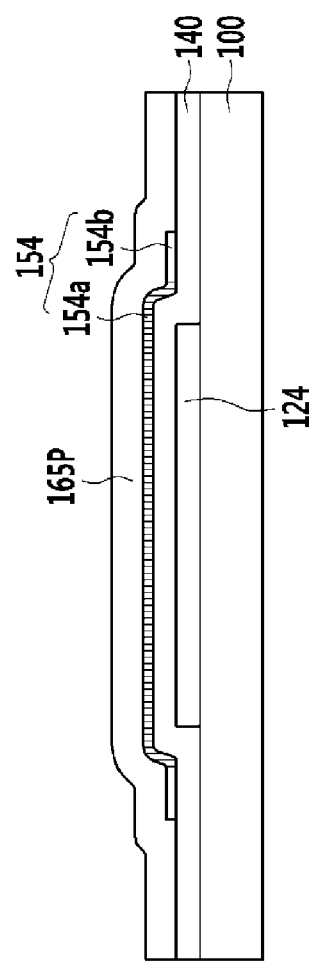

Referring to FIG. 15 and FIG. 16, a semiconductor 154, which may include the first region 154a made of crystalline silicon and the second region 154b including the amorphous silicon may be, formed by patterning the semiconductor layer 150.

Referring to FIG. 16, an insulating layer 165p may be formed on the gate insulating layer 140 to cover the semiconductor 154. The insulating layer 165p may be made of is any suitable material including, for example, silicon oxide or nitric oxide.

Figure 17:
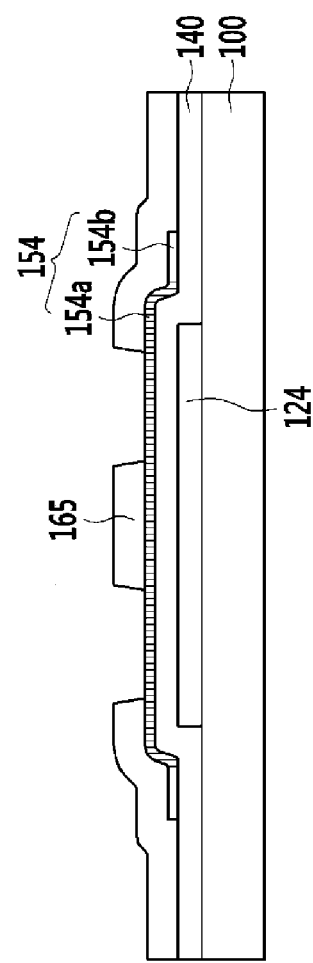

Referring to FIG. 17, the insulating layer 165p may be patterned by using a mask. An etch prevention layer 165 may be formed to cover at least a portion of the semiconductor 154 at which the channel region is formed. The semiconductor 154 may be partially exposed around the etch prevention layer 165.

Figure 18:
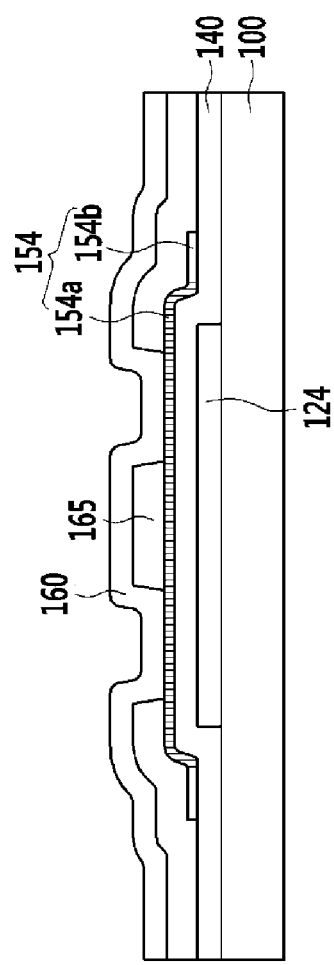

Referring to FIG. 18, a silicon layer 160 may be formed to cover the etch prevention layer 165 and the exposed semiconductor 154. The silicon layer 160 may be made of any suitable material including, for example amorphous silicon doped with an impurity (e.g., silicide).

Figure 19:
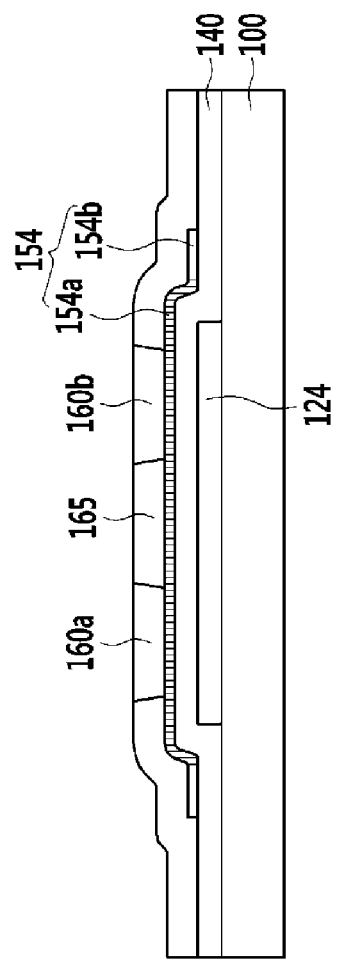

Referring to FIG. 19, the silicon layer 160 may be patterned by using a mask pattern (not shown) covering a portion of the silicon layer 160 that directly contacts the semiconductor 154. The patterned silicon layer 160 may directly contact the semiconductor 154 to form ohmic contact layers 160a and 160b.

Figure 20:
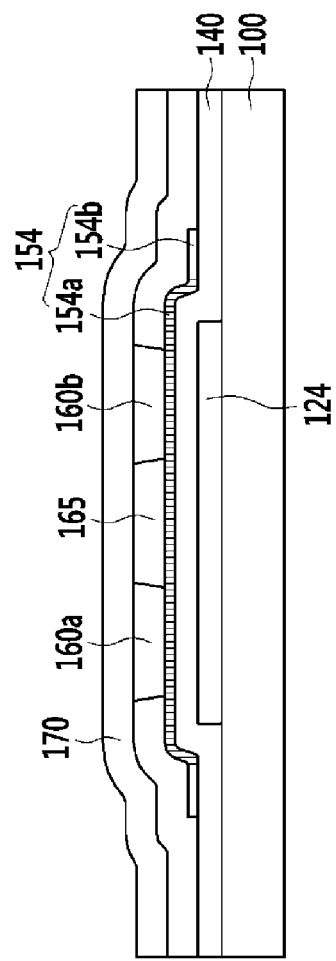
Figure 21:
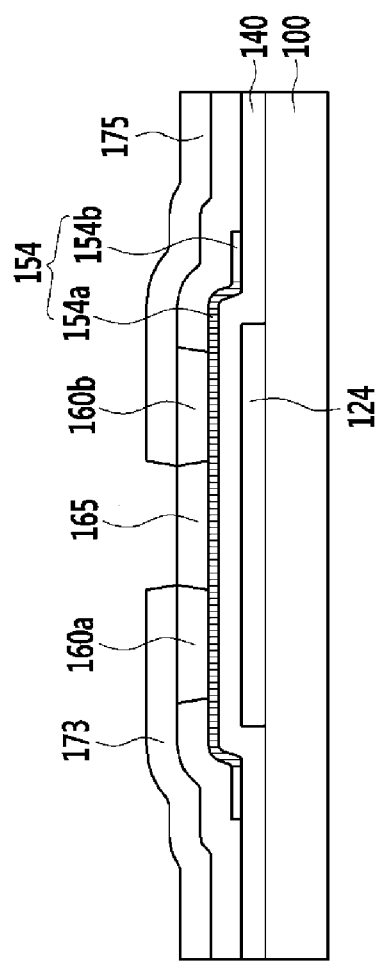

Referring to FIG. 20 and FIG. 21, a data conductive layer 170 may be formed to cover the etch prevention layer 165 and the ohmic contact layers 160a and 160b. Thereafter, the source electrode 173 and the drain electrode 175 may be formed by patterning the data conductive layer 170 so that the etch prevention layer 165 may be exposed. The source electrode 173 and the drain electrode 175 may face each other. The portion of semiconductor 154 disposed below the etch prevention layer 165 forms a channel region.

Figure 22:
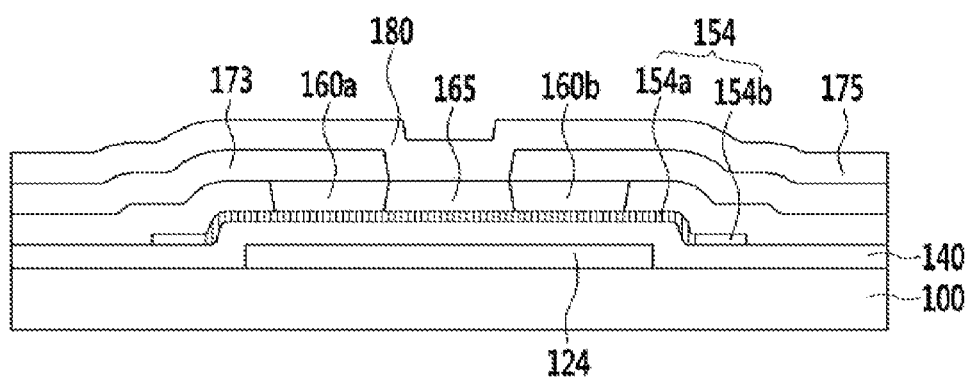

Referring to FIG. 22, a passivation layer 180 may be formed on the source electrode 173 and the drain electrode 175 to cover the exposed etch prevention layer 165. The passivation layer 180 may be made of any suitable material including, for example, an inorganic insulator (e.g., silicon nitride or silicon oxide), an organic insulator, and a low dielectric is insulator.

Although not shown, a contact hole may be formed by pattering the passivation layer 180 and a pixel electrode which may be electrically connected to the drain electrode 175 through the contact hole may be formed on the passivation layer 180.

The etch prevention layer 165 may be formed to correspond to the channel region such that it may be possible to prevent the semiconductor 154 from being damaged when patterning the data conductive layer 170.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for manufacturing a thin film transistor array panel, comprising:
    forming a gate line comprising a gate electrode on a substrate;
    forming a gate insulating layer on the gate line;
    forming a semiconductor layer on the gate insulating layer;
    crystallizing a portion of the semiconductor layer corresponding to a channel region of a thin film transistor using a micro lens array;
    forming a data line to cross the gate line, a source electrode connected with the data line, and a drain electrode on the semiconductor layer;
    patterning the semiconductor layer, thereby forming a semiconductor pattern comprising a first region made of crystalline silicon and a second region made of amorphous silicon, the first and second regions being disposed in a pixel area; and
    forming a passivation layer on the source electrode and the drain electrode.

2. The method of claim 1, wherein:
    the micro lens array comprises a plurality of micro lenses respectively corresponding to a plurality of channel regions disposed in each pixel area.

3. The method of claim 2, wherein:
    an overall planar shape of the data line, the source electrode, the drain electrode formed is the same as the semiconductor pattern except for a shape of the channel region.

4. The method of claim 3, further comprising forming an ohmic contact layer, the ohmic contact layer contacting both the first region and the second region of the semiconductor pattern.

5. The method of claim 4, wherein:
    crystallizing the semiconductor layer uses complete melting crystallization or partial melting crystallization.

6. The method of claim 1, wherein:
    crystallizing the portion of the semiconductor layer comprises locally irradiating the portion of the semiconductor layer with a laser at least two times.

7. The method of claim 6, wherein:
    an energy density of a laser irradiation after the first laser irradiation is smaller than an energy density of the first laser irradiation.

8. A method to crystallize a thin film transistor, comprising:
    forming a semiconductor layer on a substrate comprising a first pixel area, a second pixel area, and a third pixel area;
    aligning the substrate on a stage;
    crystallizing the semiconductor layer disposed at a first region of the first pixel area;
    crystallizing the semiconductor layer disposed at a second region of the second pixel area adjacent to the first pixel area;

crystallizing the semiconductor layer disposed at a third region of the third pixel area adjacent to the second pixel area; and moving the substrate between the crystallization of the semiconductor layer disposed at the first region and the crystallization of the semiconductor layer disposed at the second region and between the crystallization of the semiconductor layer disposed at the second region and the crystallization of the semiconductor layer disposed at the third region, wherein the first region, the second region, and the third region respectively correspond to channel regions of the first pixel area, the second pixel area, and the third pixel area, respectively, and wherein the crystallization of the semiconductor layer disposed at the first region, the second region and the third region is performed using a micro lens array.

9. The method of claim 8, wherein crystallizing the semiconductor layer disposed at the first region, the second region, and the third region comprises separating a beam source, and collecting the separated beam source.

10. The method of claim 9, further comprising:

after the separating and before the collecting, changing a light path of the beam source by using a mirror.

11. The method of claim 10, further comprising:

collecting the separated beam source before the changing of the light path of the beam source.

12. The method of claim 11, wherein:

separating of the beam source comprises patterning the beam source.

13. The method of claim 8, wherein:

the first pixel area, the second pixel area, and the third pixel area correspond to a red pixel, a green pixel, and a blue pixel, respectively.

14. The method of claim 8, wherein:

crystallizing the semiconductor layer comprises using complete melting crystallization or partial melting crystallization.

15. The method of claim 14, wherein:

crystallizing the semiconductor layer disposed at the first region, the second region, and the third region comprises locally irradiating the first region, the second region, and the third region with a laser at least two times, respectively.

16. The method of claim 15, wherein:

an energy density of a laser irradiation after the first laser irradiation is smaller than an energy density of the first laser irradiation.

* * * * *